US008560508B2

(12) United States Patent
Amit et al.

(10) Patent No.: US 8,560,508 B2
(45) Date of Patent: Oct. 15, 2013

(54) REAL-TIME COMPRESSION OF TABULAR DATA

(75) Inventors: Jonathan Amit, Omer (IL); Chaim Koifman, Rishon Lezion (IL); Rostislav Raikhman, Rishon Lezion (IL); Ori Shalev, Kiryat Ono (IL)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/189,327

(22) Filed: Jul. 22, 2011

(65) Prior Publication Data
US 2013/0024433 A1 Jan. 24, 2013

(51) Int. Cl.
*G06F 17/30* (2006.01)

(52) U.S. Cl.
USPC .......................................... 707/693; 707/803

(58) Field of Classification Search
None
See application file for complete search history.

(56) References Cited

U.S. PATENT DOCUMENTS

| | | | |
|---|---|---|---|
| 7,590,641 B1 * | 9/2009 | Olson | 1/1 |
| 8,046,496 B1 * | 10/2011 | Nucci et al. | 709/247 |
| 2008/0133562 A1 * | 6/2008 | Cheong et al. | 707/101 |
| 2008/0228998 A1 * | 9/2008 | Colecchia et al. | 711/103 |
| 2009/0006399 A1 | 1/2009 | Raman et al. | |
| 2010/0257147 A1 * | 10/2010 | De Peuter et al. | 707/693 |
| 2010/0278446 A1 | 11/2010 | Ganesh et al. | |
| 2010/0281079 A1 * | 11/2010 | Marwah et al. | 707/812 |
| 2010/0325094 A1 * | 12/2010 | Yang et al. | 707/693 |
| 2011/0029569 A1 * | 2/2011 | Ganesh et al. | 707/796 |
| 2011/0320418 A1 * | 12/2011 | Luo et al. | 707/693 |

OTHER PUBLICATIONS

Abadi, Daniel et al. "Integrating Compression and Execution in Column Oriented Database Systems", SIGMOD 2006, Jun. 27-29, 2006.*
Shiren Ye et al. "Detecting and Partitioning Data Objects in Complex Web Pages," School of Computing, National University of Singapore, 2003, 4 pages.
Advanced Systems, "Sadas Intelligent Engine—Column-Oriented DBMS for Business Intelligence Applications," 2008, 6 pages.
Aleksander Pivk et al., "Semantic Search in Tabular Structures," Informatica 30, 2006, pp. 143-152.

* cited by examiner

*Primary Examiner* — Fred I Ehichioya
*Assistant Examiner* — Michelle Owyang
(74) *Attorney, Agent, or Firm* — Griffiths & Seaton PLLC

(57) ABSTRACT

Exemplary method, system, and computer program product embodiments for real-time column compression of data are provided. In one embodiment, by way of example only, a data structure is estimated for an initially unknown structured data. The estimated data structure is placed in a stream. A columnar compression operation is applied to the stream to generate an achieved compression ratio. The stream is compressed. Feedback of the achieved compression ratio is analyzed from the stream to determine if an optimal one of the columnar compression operations has been applied. If the optimal one of the columnar compression operations has been applied, the actual data structure of the initially unknown structured data is determined.

18 Claims, 10 Drawing Sheets

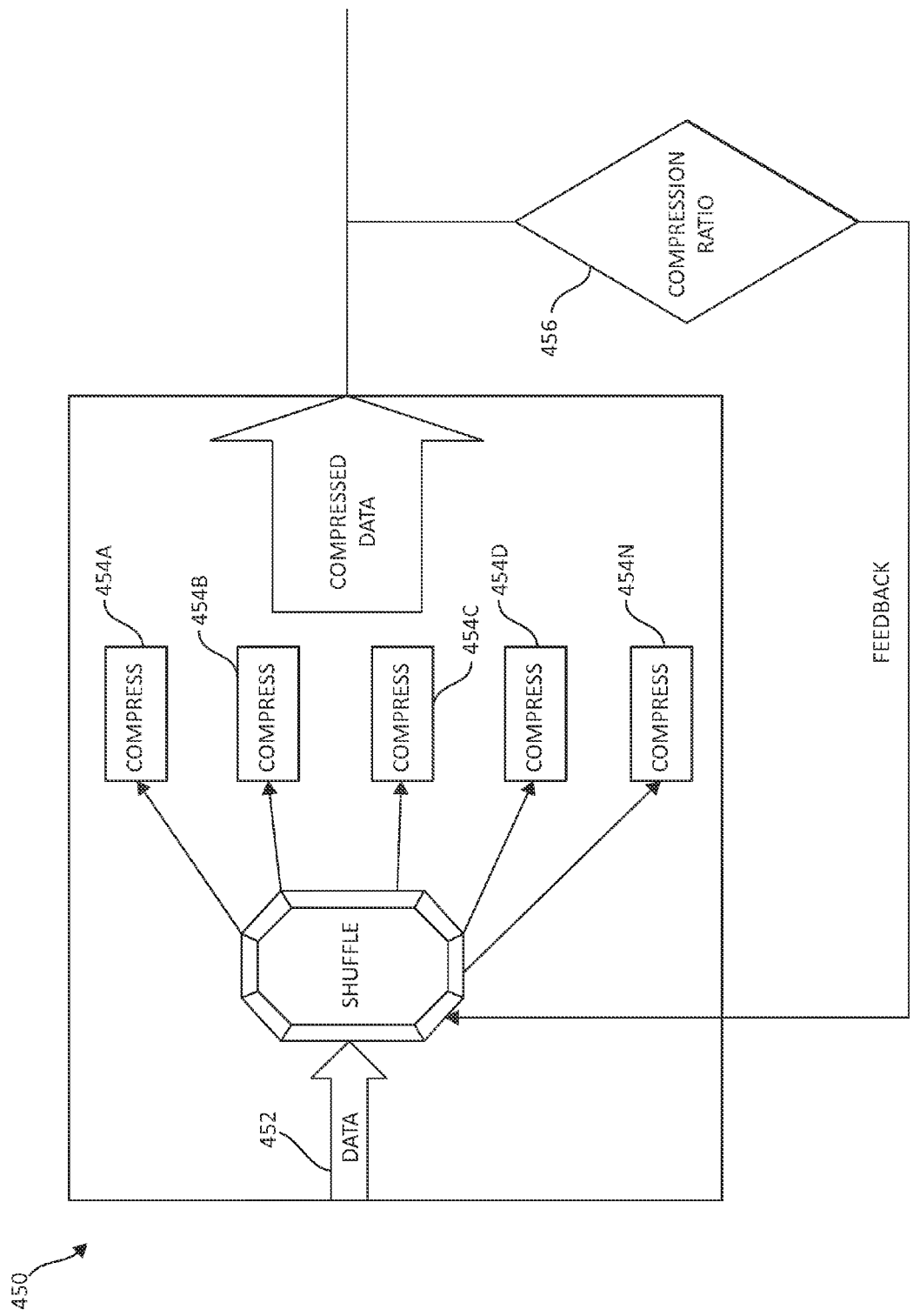

REAL-TIME COMPRESSION OF TABULAR DATA

BACKGROUND OF THE INVENTION

1. Field of the Invention

The present invention relates in general to computers, and more particularly to real time compression of data in a computing environment.

2. Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components.

Computing system are used to store and manage a variety of types of data, such as Tabular data. Tabular data is typically organized into rows and columns to form common tables, e.g., as used in relational tables, word processing documents, spreadsheets or spreadsheet-like structures, or similar database structures. The formation of these tables includes a variety of organized arrays and arrangements for the rows and columns. However, the actual physical storage of the tabular data may take a variety of forms. For example, although the logical structure of the tabular data may be multidimensional, the tabular data may physically be stored in linear format, such as in row-major or column major format. In row-major format, column values of a row from the table-like structure are stored contiguously in persistent storage. By contrast, in column-major format, for a given column of multiple rows, column values of the column are stored contiguously.

Data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security. Tabular data structures would also benefit from data compression since data compression is useful to reduce the consumption of expensive resources, such as hard disk space or transmission bandwidth.

SUMMARY OF THE DESCRIBED EMBODIMENTS

Since data storage is expensive, it is clearly desirable to minimize the amount of storage required to store structured data. Additionally, when a data sequence is copied or transferred between storage locations, it is desirable to minimize the overhead in terms of CPU cycles, network usage, etc. within the database field, much research has been carried out in to techniques for maintaining copies of data. In tabular data, compressing each column independently would provide for a higher compression ratio rather than compressing the entire table with one stream. The reason for the increased compression ratio is that the data in each column is relatively homogeneous. However, storage controllers are unaware of the tabular structure since they cannot apply column compression algorithm(s) and cannot benefit from the increased compression ratio. As a result, efficiency and productivity may be reduced.

Accordingly, and in view of the foregoing, various exemplary method, system, and computer program product embodiments for real-time column compression of data are provided. In one embodiment, by way of example only, a data structure is estimated for an initially unknown structured data. The estimated data structure is placed in a stream. A columnar compression operation is applied to the stream to generate an achieved compression ratio. The stream is compressed. Feedback of the achieved compression ratio is analyzed from the stream to determine if an optimal one of the columnar compression operations has been applied. If the optimal one of the columnar compression operations has been applied, the actual data structure of the initially unknown structured data is determined.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

As previously mentioned, due to the expenses and resources required for data storage, it is desirable to minimize the amount of storage required to store structured data. Additionally, when a data sequence is copied or transferred between storage locations, it is desirable to minimize the overhead in terms of CPU cycles, network usage, etc. within the database field. In tabular data, compressing each column independently would provide for a higher compression ratio rather than compressing the entire table with one stream. The reason for the increased compression ratio is that the data in each column is relatively homogeneous. However, storage controllers are unaware of the tabular structure since they cannot apply column compression algorithm(s) and cannot benefit from the increased compression ratio. As a result, efficiency and productivity may be reduced.

In contrast, and to address the inefficiencies and performance issues previously described, the illustrated embodiments provide mechanisms for detecting tabular data and executing column compression algorithms to enable higher compression ratio. The mechanisms, for example, estimate a data structure for an initially unknown structured data in a storage controller. The estimated data structure may be placed in a stream. A columnar compression operation may be applied to the stream to generate an achieved compression ratio. The stream may be compressed. Feedback of the achieved compression ratio may be analyzed from the stream to determine if an optimal one of the columnar compression operations has been applied. If the optimal one of the columnar compression operations has been applied, the actual data structure of the initially unknown structured data may be determined.

Figure 1:
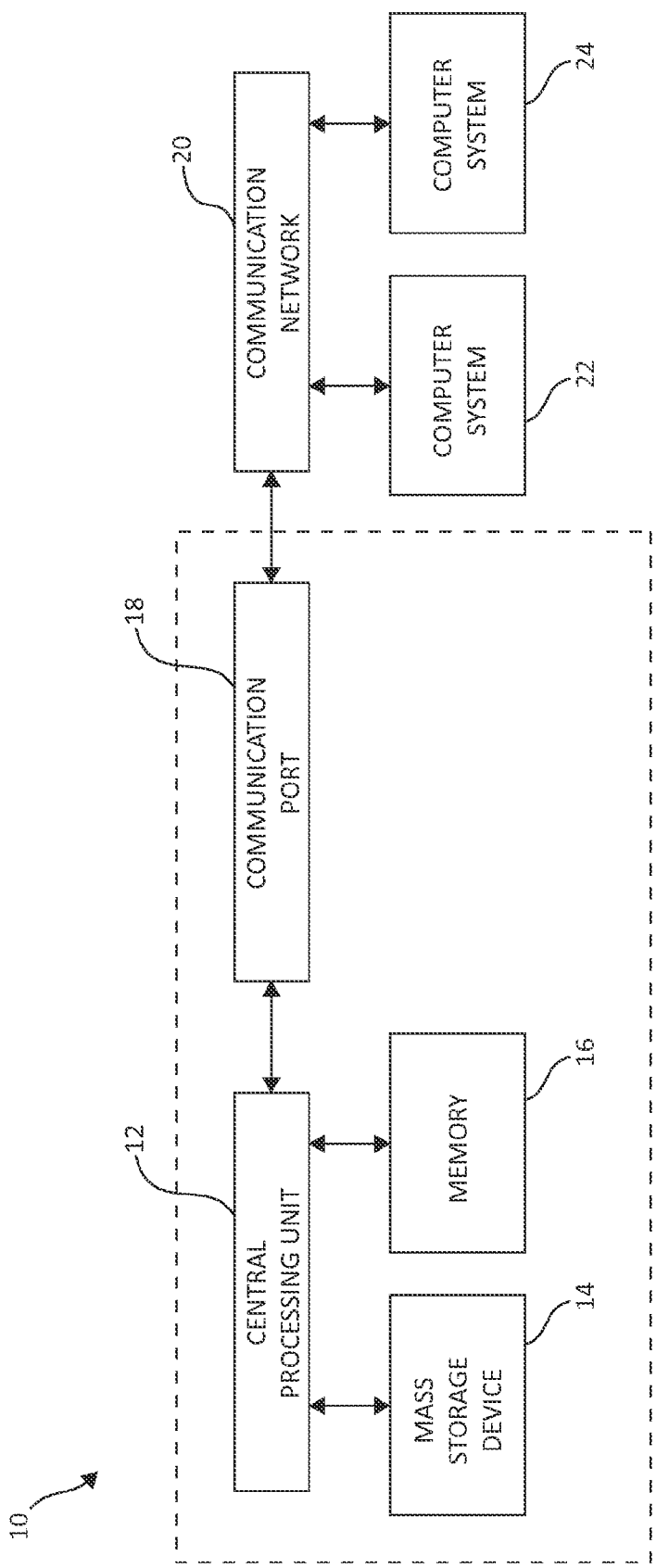
FIG. 1 illustrates a computer storage environment having an example storage device in which aspects of the present invention may be realized.

Turning now to FIG. 1, exemplary architecture 10 of data storage systems (e.g., virtual tape systems) in a computing environment is depicted. The computer system 10 includes central processing unit (CPU) 12, which is connected to mass storage device(s) 14 and memory device 16. Mass storage devices can include hard disk drive (HDD) devices, solid-state devices (SSD) etc, which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
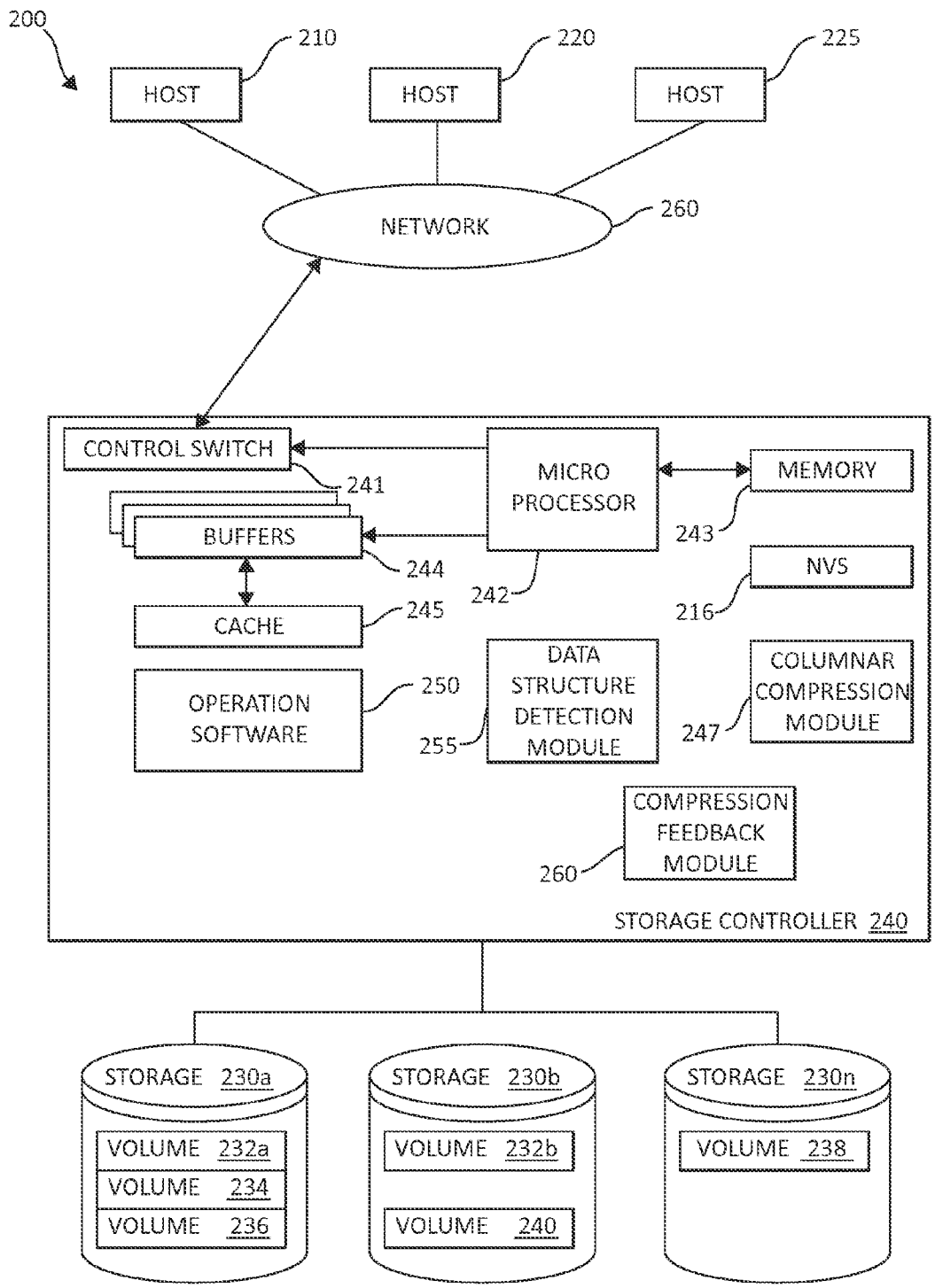
FIG. 2 illustrates an exemplary block diagram showing a hardware structure of a data storage system in a computer system in which aspects of the present invention may be realized.

FIG. 2 is an exemplary block diagram 200 showing a hardware structure of a data storage system in a computer system according to the present invention. Referring to FIG. 2, there are shown host computers 210, 220, 225, each acting as a central processing unit for performing data processing a part of a data storage system 200. The hosts (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 1 comprising storage controller 240 and storage 230.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Storage 230 may be comprised of one or more storage devices, such as storage arrays, which are connected to storage controller 240 by a storage network.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps associated with managing storage 230 and executing the steps and methods of the present invention for real-time compression of tabular data in a computer storage environment. In one embodiment, system memory 243 includes, is associated, or is in communication with the operation software 250 for real-time compression of tabular data in a computer storage environment, including the methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the Cache 245 for any purposes suited to accomplish the objectives of the present invention. In some embodiments, a backup power source (not shown in FIG. 2), such a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a data structure detection module 255, a columnar compression module 247, and a compression feedback module 260 to assist with real-time compression of tabular data in a computer storage environment. The data structure detection module 255, columnar compression module 247, and compression feedback module 260 may work in conjunction with each and every component of the storage controller 240, the hosts 210, 220, 225, and storage devices 230. Both the data structure detection module 255, columnar compression module 247, and compression feedback module 260 may be structurally one complete module working together and in conjunction for real-time compression of tabular data in a computer storage environment or may be individual modules. The data structure detection module 255, columnar compression module 247, and compression feedback module 260 may also be located in the cache 245 or other components of the storage controller 240 to accomplish the purposes of the present invention.

The storage controller 240 may be constructed with a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control and each table described later, cache 245 for temporarily storing (buffering) data, and buffers 244 for assisting the cache 245 to read and write data, a control switch 241 for controlling a protocol to control data transfer to or from the storage devices 230, change ownership module 255, and a cartridge module 247 on which information may be set. Multiple buffers 244 may be implemented with the present invention to assist with the real-time compression of tabular data in a computer storage environment.

In one embodiment, by way of example only, the host computers or one or more physical or virtual devices, 210, 220, 225 and the storage controller 240 are connected through a network adaptor (this could be a fiber channel) 260 as an interface i.e., via a switch called "Fabric." In one embodiment, by way of example only, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, change ownership module 255, and cartridge module 247 are in communication with each other and may be separate or one individual component(s). Also, several, if not all of the components, such as the operation software 245 may be included with the memory 243 for real-time compression of tabular data in a computer storage environment. Each of the components within the storage device may be linked together and may be in communication with each other for purposes suited to the present invention.

Figure 3:
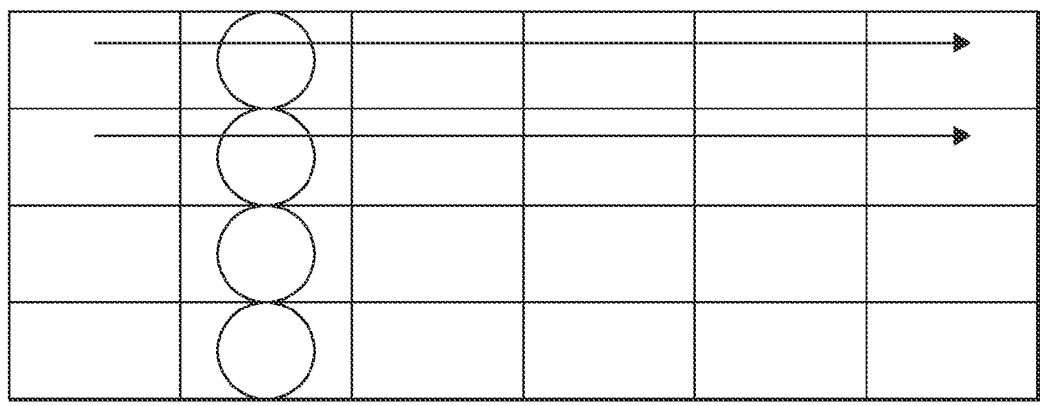
FIG. 3 illustrates an exemplary block diagram showing related data encountered equal to the width of a table row.

As previously mentioned, the illustrated embodiments provide mechanisms for real-time compression of tabular data within a computing storage environment. FIG. 3 illustrates an exemplary block diagram 300 showing related data encountered equal to the width of a table row. For example, a table is illustrated with 4 data columns across the top labeled as ID, Product Name, Price, Category, and Discount. The table includes 4 rows underneath each of the column name labels. Each row includes tabular data with a variety of characters (e.g., a certain number of bytes) contained in each row. The second table illustrates the same table, but the circles (e.g., representing the data in rows under the product name column) represent related data that is encountered in some frequency, which is equal to the width of a table row. These circles are analogous to the "Product Name" column in the table above. As illustrated with the circles and the arrows pointing to the left, the table is illustrating the flow of execution for detecting the tabular data. Since the table includes structured data, when the data is incoming (e.g., incoming into a storage controller) the mechanisms of the present invention attempt to estimate and/or "guess" the data structure (e.g., guess/shuffle the row width of each of the table row). In FIG. 3, the rows under the product name show the guessing of the structured data. Next, the data may be reorganized with a one or more columnar compression operation(s) (algorithms) being applied to the data and then the data may be compressed. In one embodiment, the mechanisms analyze the results of the compression operation and make a decision on whether to continue the adjusting the estimated data structures in order to obtain the actual table row width of the table. This process may continue and repeat until the incoming tabular data structure is accurately identified (e.g., the table row width and the column width). It should be noted that two options are available. In one option the method may reprocess the data repeatedly (again and again) until a satisfactory compression ratio is obtained. The second option may be to move to the next chunks of input, altering and/or adjusting the parameters in order to obtain a more satisfactory compression ratio and leaving the previous chunks of input tabular data as not being optimally compressed.

As will be described below, in one embodiment the mechanisms of the illustrated embodiments seek to provide the ability for real-time compression of tabular data. In one embodiment, the mechanisms detect the tabular structure of the data in a storage controller. The mechanisms detect the tabular structure by using a combination of column compression to enable higher compression ratio on the storage controller. The mechanism use compression feedback, common delimiters and/or common cell padding patterns, and/or a combination of common delimiters and/or common cell padding patterns for the detection of the incoming tabular data structure.

Figure 4A:
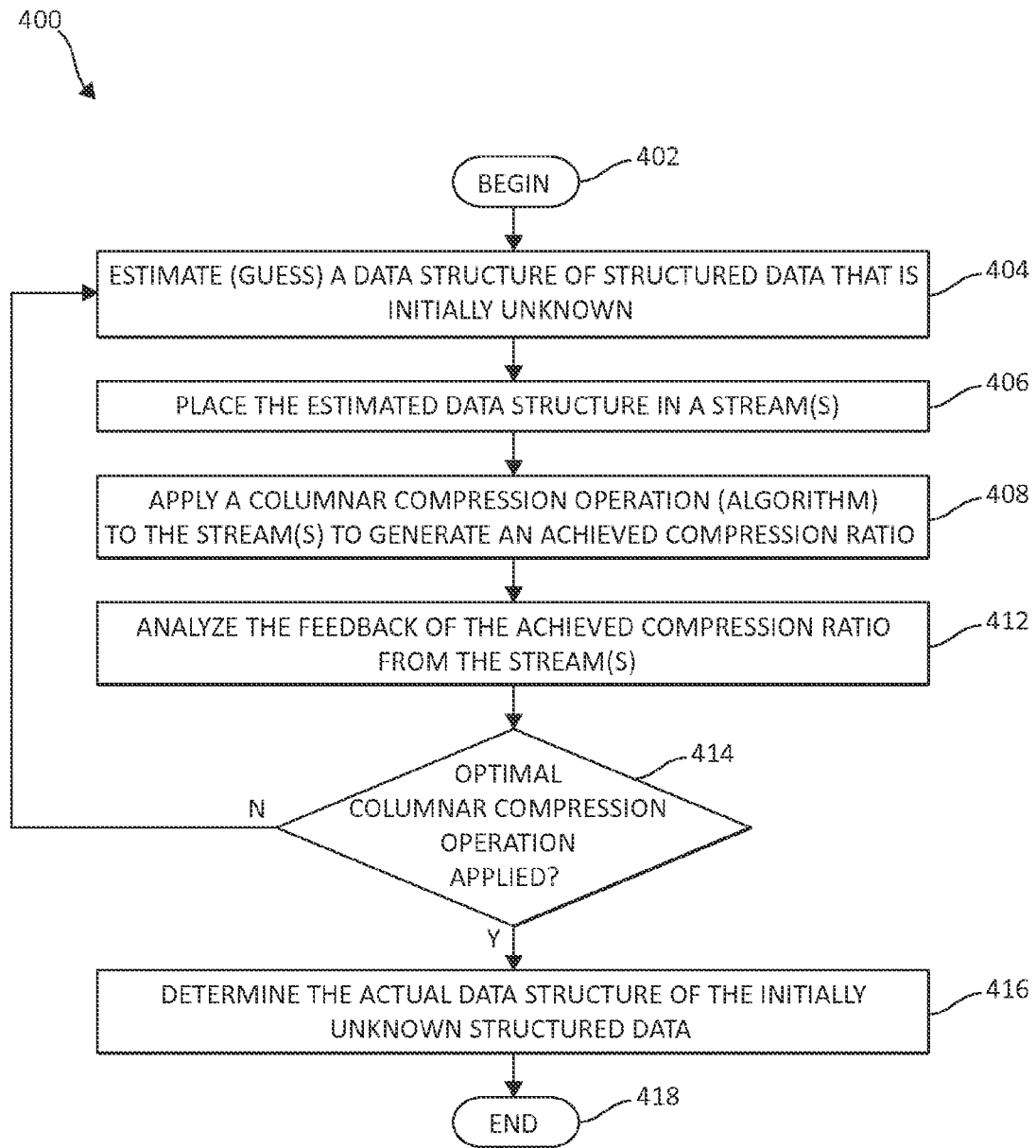
FIG. 4 is a flowchart illustrating an exemplary method for real-time column compression of tabular data.

FIG. 4A is a flowchart illustrating an exemplary method 400 for real-time column compression of tabular data. The method 400 begins (step 402) by estimating (guessing) a data structure of structured data that is unknown (step 404). For example, since a storage controller is unaware of the tabular structure of the incoming data, the table row width of the tabular data is unknown so as part of detecting the tabular data, a best guess or estimate may be used to determine the table row width (e.g., estimate/guess the table row characters/bits are 10 bits wide). The estimated data structure may be placed in a stream(s) (step 406). The estimated data structure may be placed in one or more streams. The method 400 will apply a columnar compression operation(s) (algorithm) to the stream(s) to generate an achieved compression ratio (step 408). (The streams are compressed). The method 400 will then analyze the feedback of the achieved compression ratio from the stream(s) (step 412). The method 400 will determine if the optimal columnar compression operation has been applied (step 414). If no, the method 400 will return and estimate (guess) a data structure of structured data that is unknown (step 404) and repeat the subsequent steps. However, the estimating (guessing) a data structure of structured data that is unknown may be performed on the same data that is being processed by the method over and over and/or it may perform this (and any other step of the method) on the next chunk of input data. If the optimal columnar compression operation has been applied, the method 400 will determine the actual data structure of the initially unknown structured data (step 416). The method 400 ends (418).

FIG. 4B illustrates an exemplary block diagram 450 for real-time column compression of tabular data. As illustrated in FIG. 4B, incoming data 452 may be received (e.g, in a storage controller) but the structure data that is unknown. Thus, the incoming data 452 may be shuffled into a number of compression streams 454 (e.g., shown in the figure as 454a, b, c, d, and n) and the data structure may be estimated (e.g., the table row may be guessed to be of a certain frequency). For example, since a storage controller may be unaware of the tabular structure of the incoming data 452 and the table row width of the tabular data is unknown, so as part of detecting the tabular data, a best guess or estimate may be used to determine the table row width (e.g., estimate/guess the table row characters/bits are 10 bits wide). The estimated data structure may be placed in a stream(s) 454. The estimated data structure may be placed in one or more streams 454. A columnar compression operation(s) (algorithm) may be applied to the stream(s) 454 to generate an achieved compression ratio 456. The feedback of the achieved compression ratio 456 may be analyzed from the streams 454 and assists in detecting if an optimal columnar compression operation has been applied and selecting another columnar compression operation to achieve the optimal achieved compression ratio. This optimal achieved compression ratio may be based on the highest compression ratio generated from the compressed stream.

Figure 5:
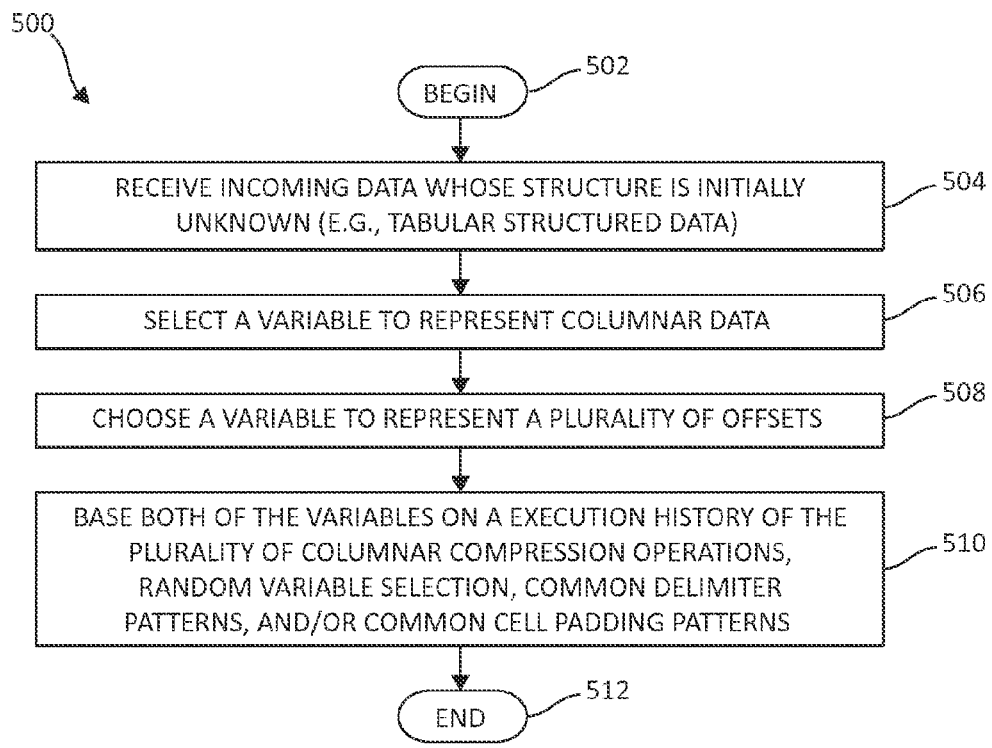
FIG. 5 is a flowchart illustrating an exemplary method for estimating a data structure of initially unknown structured data.

In one embodiment, the mechanisms initially estimate and guess the tabular structure of data, as mentioned above (FIG. 4A step 404). FIG. 5 is a flowchart illustrating an exemplary method 500 for estimating a data structure of initially unknown structured data. The method 500 begins (step 502) and receives incoming data whose structure may be initially unknown (e.g., tabular structured data) (step 504). The method 500 will select a variable (an N number of columns, which can be initially selected to be of some fixed size) to represent columnar data (step 506). A variable may be also chosen to represent an offset $O_N$ for representing a table row width (step 508). For example, a table may have table rows each with 200 characters (bytes) wide. The first row will be offset 0 through 200. The second row would be offset 200 through 400. These rows may represent sequential data in a table or structured container. Inside each of these 200 byte rows may be 10 fields each with 20 bytes wide. The first cell, 1,1 may be offset 0 through 20, the second field 1, 2 will be offset 20 through 40, and last, the right most cell of the first row will start at 180 and end at 200. Now, the first column, the data 0 to 20 may be attached to 200 through 220, and 400 through 420. The data in these sets of bytes represents the first column. The second column is 20 through 40, 220 through 240, 420 through 440, and 620 through 640. Such is a simplistic example where the 10 fields are of equal size, but in most cases the fields may be of different sizes. The offsets may be represented as compression streams being sequentially feed as follows:

$$\{[oi-1,oi], [oN+oi-1, oN+oi), [2oN+oi-1, 2oN+oi), \\ [3oN+oi-1, 3oN+oi), \dots\} \quad (1)$$

where o0 is equal to zero (0), oN is the width of a single table row (e.g., the number of bits in each row), hence, 2*oN (or 2oN) is the offset where the third row begins. o1 is the width of the first column (it should be noted that the term "oi" is the ith width). o2 is the width of the first two columns. o3 is the width of the first three columns. oN+o1 is where the second cell of the second row begins. oN+o2 is where the third cell of the second row begins. 2*oN+o1 is where the second cell of the third row begins. The range [2*oN+o1, 2*oN+o2) is exactly where the data of the second cell in the third row is located. K*oN+oX is where the cell number "X+1" in row number K+1 starts.

The method 500 will base both of the variables on a execution history of the plurality of columnar compression operations, random variable selection, common delimiter patterns, and/or common cell padding patterns (step 510). The method 500 ends (512).

Figure 6:
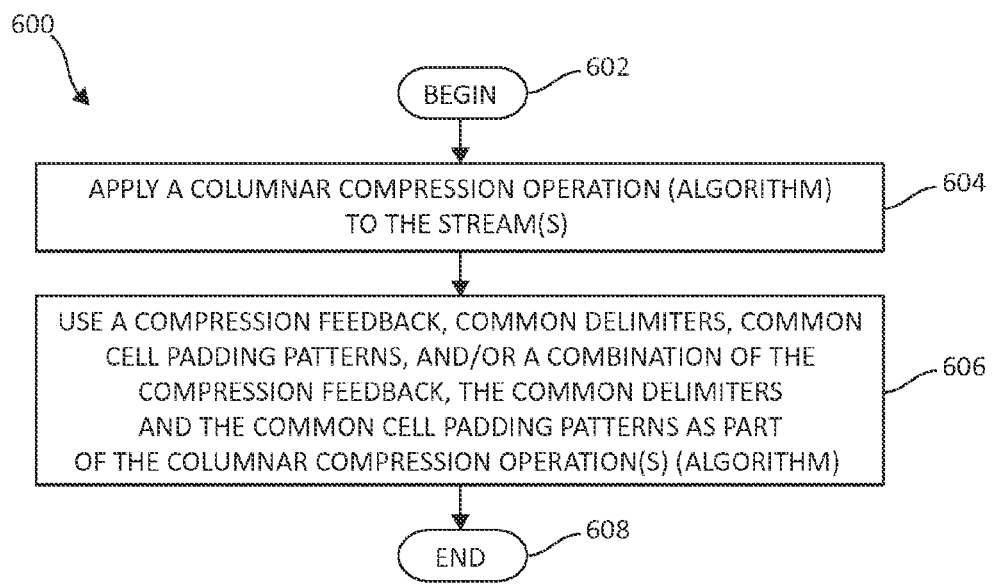
FIG. 6 is a flowchart illustrating an exemplary method for applying a columnar compression operation to a stream to generate an achieved compression ratio.

As mentioned in FIG. 4A step 408, a columnar compression operation(s) (e.g., an algorithm) may be applied to the stream(s) to generate an achieved compression ratio. This assists in detecting the correct table row width of the incoming tabular data. With the foregoing in mind, FIG. 6 is a flowchart illustrating an exemplary method 600 for applying a columnar compression operation to a stream to generate an achieved compression ratio. The method 600 begins (step 602) by apply a columnar compression operation (algorithm) to the stream(s) (step 604). The method 600 uses a compression feedback, common delimiters, common cell padding patterns, and/or a combination of the compression feedback, the common delimiters and the common cell padding patterns as part of the columnar compression operation(s) (algorithm) (step 606). The method 600 ends (step 608).

Figure 7:
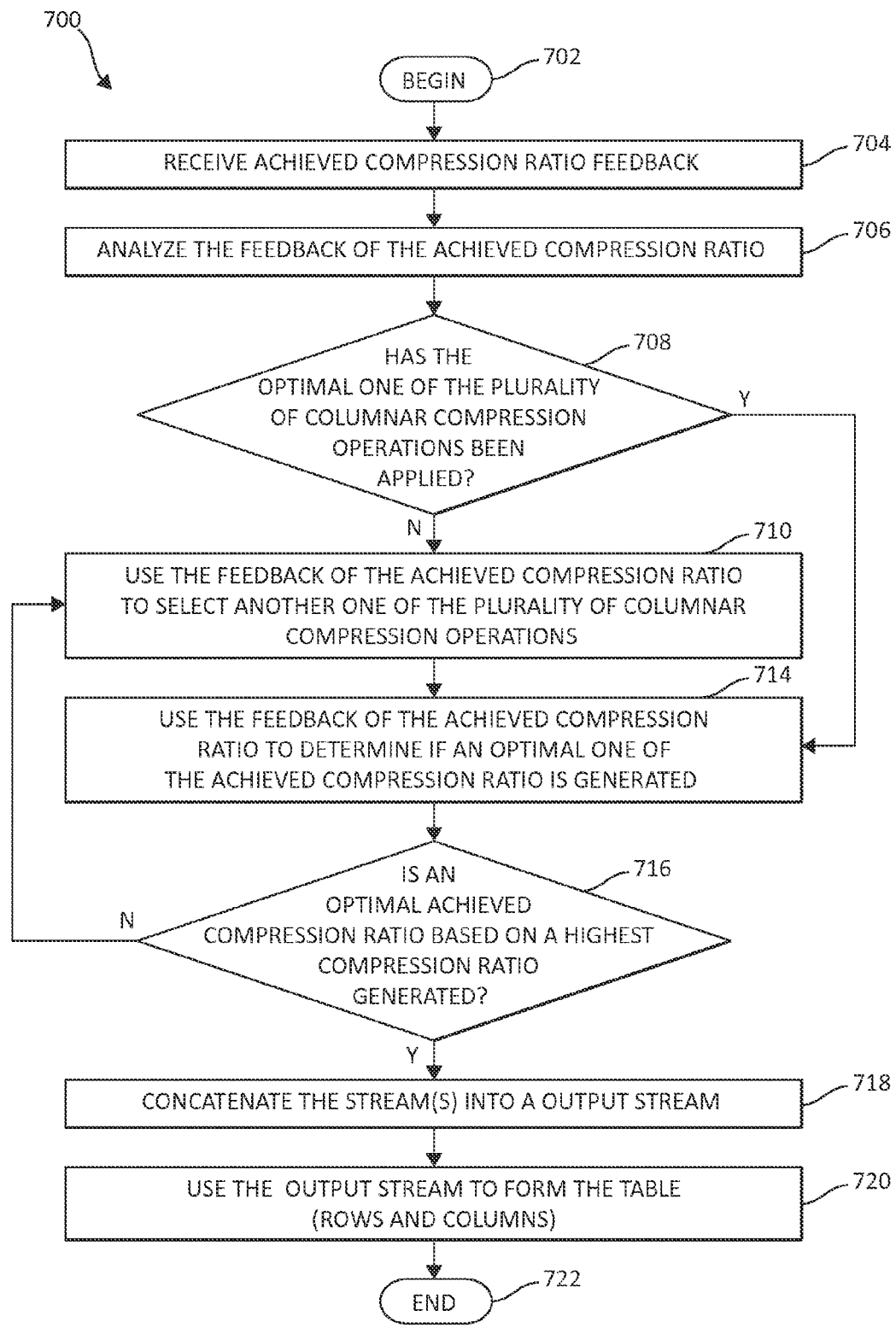
FIG. 7 is a flowchart illustrating an exemplary method for analyzing feedback of the achieved compression ratio.

Having applied one or more columnar compression operation(s) (algorithm) to the stream(s) to generate an achieved compression ratio, the stream(s) are then compressed. Given the original estimated structure may or may not be accurate as to the actual table row and column width, the feedback obtained from the compressed streams allow the mechanisms of the present invention to determine the actual structure of tabular data structure. FIG. 7 is a flowchart illustrating an exemplary method 700 for analyzing feedback of the achieved compression ratio. The method 700 begins (step 702) by receiving the achieved compression ratio feedback (step 704). The method 700 will analyze the feedback of the achieved compression ratio (step 706). The method 700 determines if the optimal one of the plurality of columnar compression operations been applied (step 708). If no, the method 700 will use the feedback of the achieved compression ratio to select another one of the plurality of columnar compression operations (step 710). The feedback provides a barometer and guidance for selecting the next type of columnar compression algorithms. If yes, the method 700 will use the feedback of the achieved compression ratio to determine if an optimal one of the achieved compression ratio is generated (step 714). The method 700 determines if optimal achieved compression ratio is based on the highest compression ratio generated from the compressed stream(s) (step 716). If no, the method 700 returns and uses the feedback of the achieved compression ratio to select another one of the plurality of columnar compression operations (step 710). If yes, the method 700 will concatenate the stream(s) into an output stream (step 718). The output stream may be used to form the table (e.g., rows and columns) (step 720). The method 700 ends.

Figure 8:
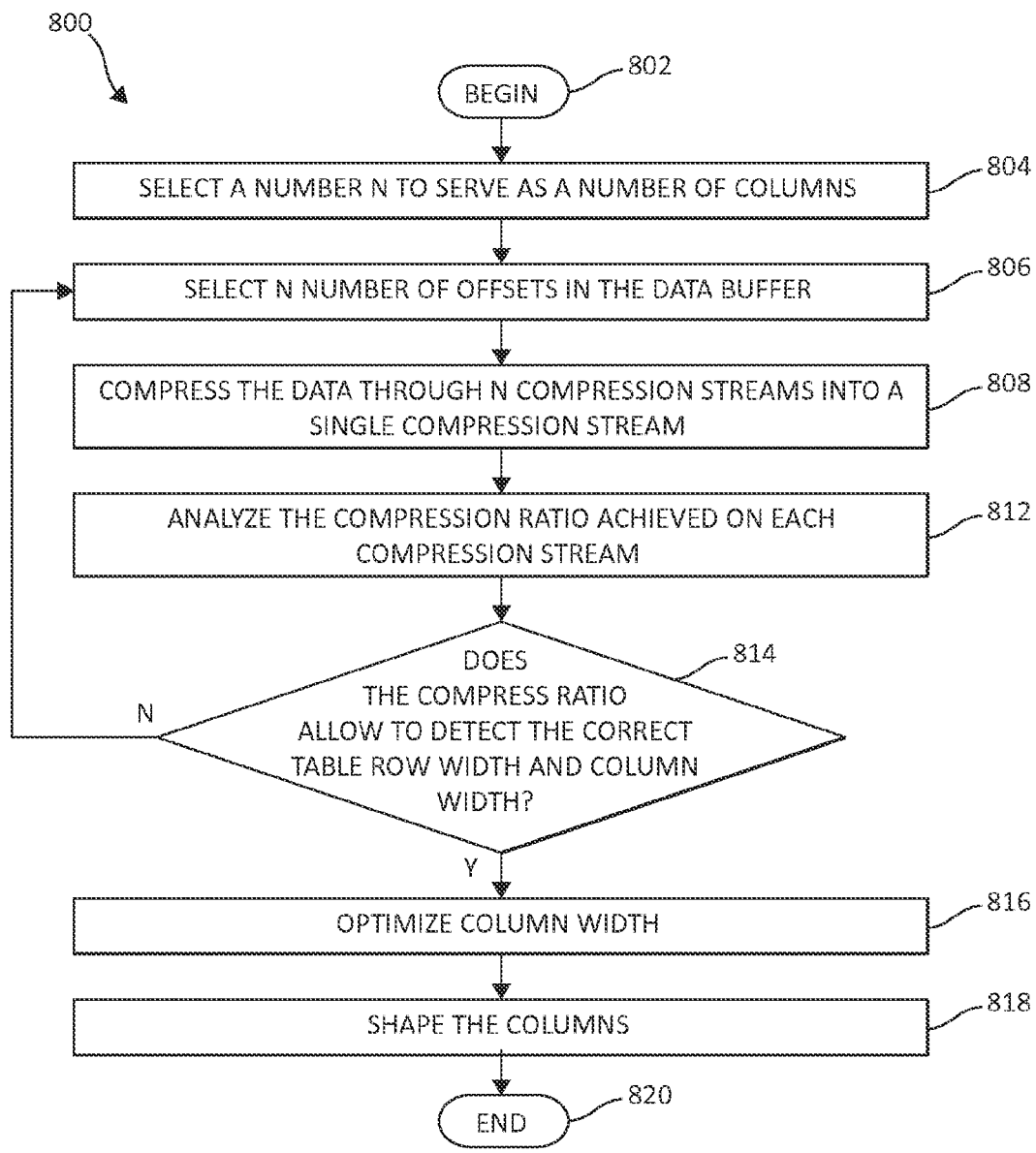
FIG. 8 is a flowchart illustrating an exemplary method for detecting tabular data to enable higher compression ratio.

FIG. 8 is a flowchart illustrating an exemplary method 800 for detecting tabular data to enable higher compression ratio. The method 800 begins (step 802) selects an N number (variable) to serve as a number of columns (step 804). The method 800 will select N number (variable) of offsets in the data buffer (step 806), may initially be of fixed size. The method 800 will compress tabular data through N compression streams (step 808). The method 800 will analyze the compression ratio achieved on each compression stream (step 812). The method 800 will check if the compression ratio achieved from each compression stream(s) allow to detect the correct table row and column width (step 814). If no, the method 800 will return and select an N number (variable) to serve as a number of columns (step 804). If yes, the method 800 will optimize column width (step 816). The method 800 will then commence shaping the columns by use of the compression streams (step 818). Shaping the columns is done by changing the size of columns, merging two or more columns together, or splitting a column into more than one column. The method 800 then ends (step 820).

Figure 9:
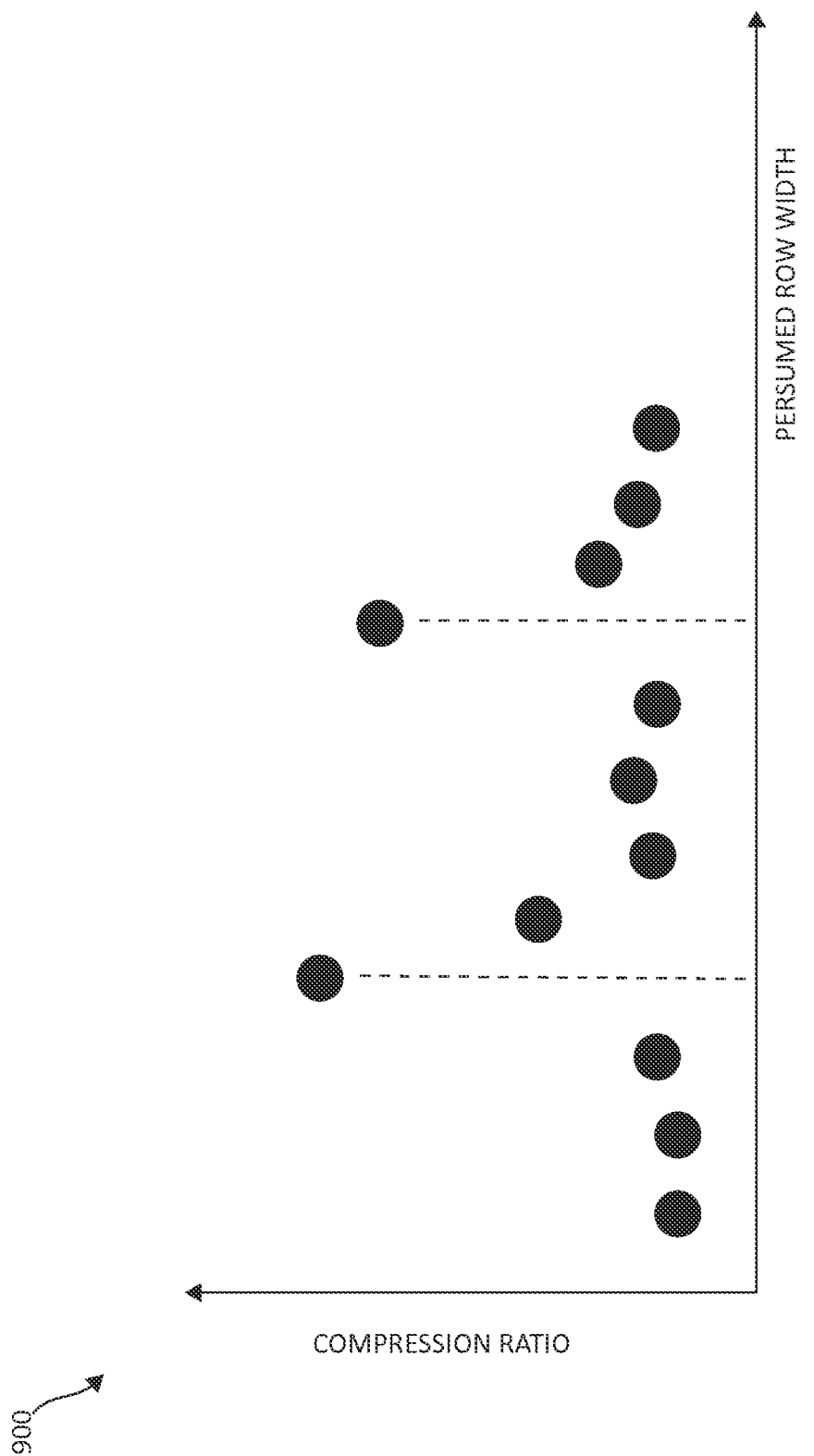
FIG. 9 illustrates an exemplary block diagram (graph) showing the optimal achieved compression ratio.

In order to detect the structure of the incoming initially unknown structured data, the mechanism may require a fixed number of repetitions of shuffling (e.g., estimating/guessing) the incoming data into various sizes to detect the tabular row width. As part of these repetitions of shuffling the incoming data into various sizes, the mechanisms may analyze the feedback of the achieved compression ratio from the stream and select an optimal columnar compression operation has been applied analyze the feedback of the achieved compression ratio from the stream and select the optimal achieved compression ratio. This optimal achieved compression ratio may be based on the highest compression ratio generated from the compressed stream. FIG. 9 illustrates an exemplary block diagram 900 (graph) showing the optimal achieved compression ratio. In one embodiment, the graph's x-axis may be the presumed (estimated) table row width, i.e. the frequency of related data, and the y-axis may be the compression ratio measured in the number of experiments. Each point on the graph represents an experiment on a specific table row width. When the actual format of the input data was tabular with rows of width x, maximum points on x and 2x are displayed, as illustrated in the graph. The first maximum point (x) may be the frequency (width) of one row and the second maximum point (2x) may be the frequency of two rows. One of the ways to identify the correct row width is to select a double width and obtaining a higher compression ratio. By performing such fixed number of experiments and analyzing the resulted graph, the correct table row width maybe deduced. For example, if you guess a table row width to be more than the original table row by a single byte, then there may be a shift on every row by a single byte and the compression ratio will be less accurate and not optimal.

Following the deducing and detecting the correct table row width(s), the width of the columns may be identified and optimized. Identifying the columns correctly may significantly affect the compression ratio, for example, if the column size is 20 bytes, but the initial data structure may be estimated to be five 4-byte columns, the column's data may be handled by five separate compression streams. However, estimating and/or guessing the correct column width will cause the 20-byte records of that column to be fed into a single compression stream, leading to higher compression ratio.

Figure 10A:
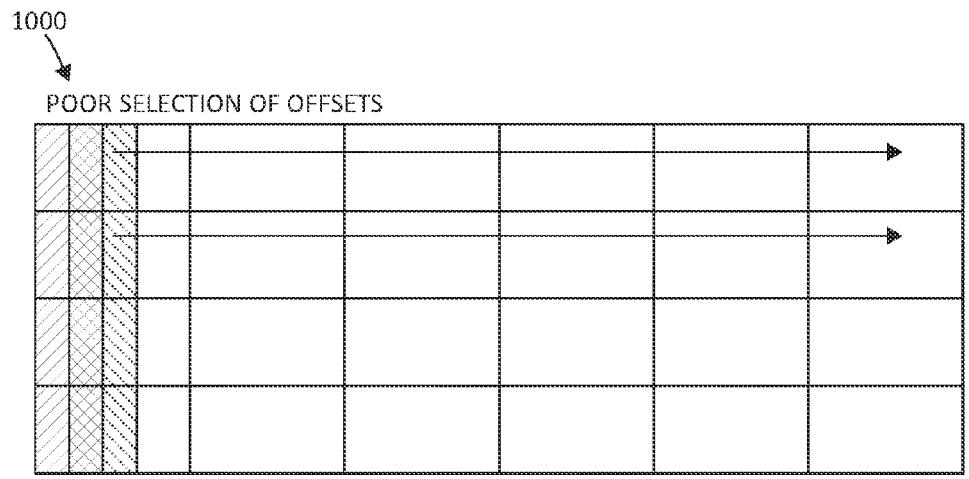
FIG. 10A illustrates an exemplary block diagram (graph) showing the selection of offsets with a table row width detected.
Figure 10B:
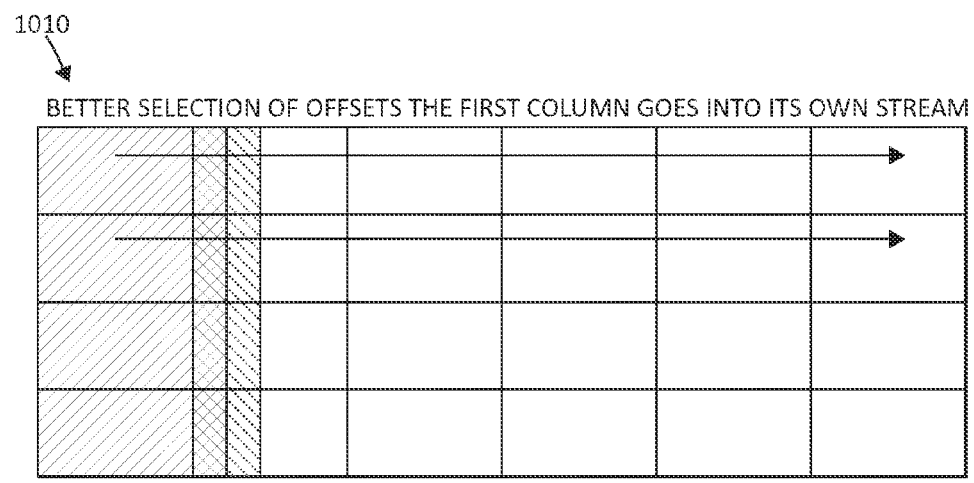
FIG. 10B illustrates an exemplary block diagram (graph) showing the selection of offsets with a table row width and the first column detected.
Figure 10C:
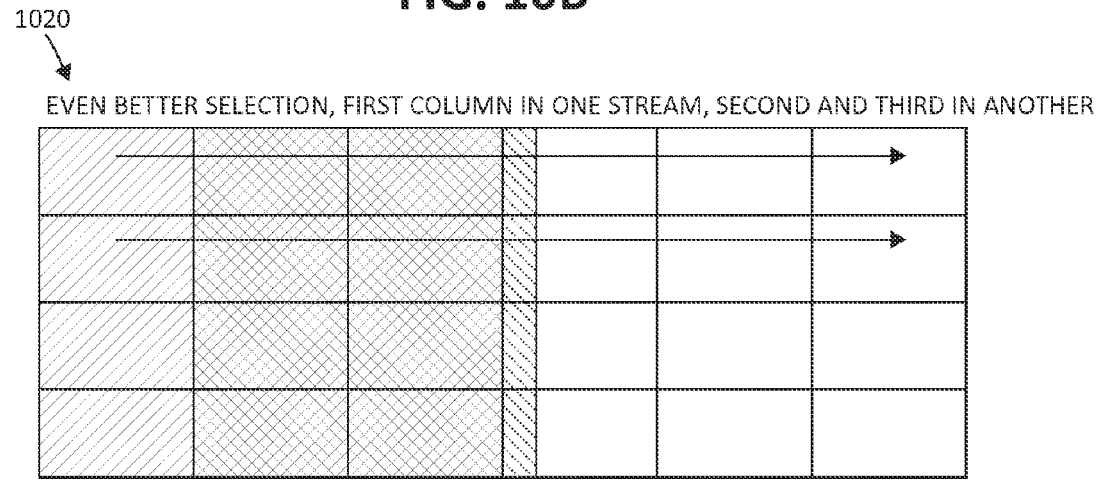
FIG. 10C illustrates an exemplary block diagram (graph) showing the selection of offsets with a table row width detected, first column detected, and the second and third columns detected as a single column to yield a significantly higher compression ratio.

Turning to FIG. 10A-C, example illustrations are provided to show the selection of offsets and corresponding identified table row widths and column width(s). FIG. 10A illustrates an exemplary block diagram (graph) 1000 showing the selection of offsets with a table row width detected. However, the columns are not yet identified. (In FIG. 10A-C, each of the various patterns, as shown, represents data in a separate compression stream and assumes the row width has been detected). As illustrated in FIG. 10A, the original column of the original table has been sliced into three separate columns, and the estimation failed to identify the columns. FIG. 10A, may be viewed as a poor selection of offsets. FIG. 10B illustrates an exemplary block diagram (graph) 1010 showing the selection of offsets with a table row width and the first column detected. However, the other columns are not identified. In FIG. 10B, the width of the column illustrates the entire width of the first column was identified correctly and feed sequentially into the first compression stream and generated since the data was homogeneous. FIG. 10C illustrates an exemplary block diagram (graph) showing the selection of offsets with a table row width detected, first column detected, and the second and third columns detected as a single column to yield a significantly higher compression ratio.

As an example of the foregoing, consider the following for columnar compression of unstructured data. First, unstructured data arrives as input. For purposes of this example, delimiters will not be initially used and pure binary data will be used since this may be the first experiment performed on the incoming data, thus making it difficult to use compression feedback, common delimiters and/or common cell padding patterns, and/or a combination of common delimiters and/or common cell padding patterns for the detection of the incoming tabular data structure. A table may be extremely large with more than 1 GB (gigabyte) of data. The table may be broken down into smaller 1 MB sections of data to perform experiments on the smaller 1 MB data sections to find the best estimation (shuffle/selection) of the data structure. The first 1 MB of data may be sliced into sixteen (16) 8-byte stripes (columns), as if the data is a table of 16 columns with eight bytes each (e.g., 16 fields of 8 bytes). This is equivalent to the estimating/guessing the structure of the tabular data. The mechanisms shuffle each stripe (column) into compressions streams and each stream may be compressed individually. The 16 output data pieces are concatenated into a single output stream corresponding to the 1 MB of input data. On the second 1 MB of input data, a slightly different structure may be selected (estimated/guessed), for example, 15 eight-byte stripes. A record may be kept of the achieved compression ratio. The number of slices may be changed every 1 MB of input data, searching for the best compression ratio. After a few dozen times of changing the selection (estimation) of data structures to find the frequency (width) of the single row, allows the mechanisms to being shaping and/or forming the columns—starting with the first column while trying to merge the first two stripes. By joining the first two columns a higher compression ratio may be obtained, rather than keeping them separated. Next, the first three stripes are merged. Once a significantly better compression ratio (e.g., optimal achieved compression ratio) is reached or obtained, the mechanisms may proceed to merge the next adjacent stripes. By obtaining the optimal achieved compression ratio (e.g., the optimal size of output divided by the size of the input) provides the indication of the exact row frequency. This allows for the each of the columns to be formed and optimized. This process may continue as needed.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for real-time column compression of data by a processor device in a computing environment, the method comprising:
   (a) estimating a data structure of initially unknown structured data to generate an estimated data structure with a row width and a column width, wherein the estimated data structure includes one or more rows, wherein each row includes two or more columns;
(b) placing the estimated data structure in at least one stream;
(c) applying at least one of a plurality of columnar compression operations to the at least one stream to generate an achieved compression ratio and to determine an actual data structure of the initially unknown structured data, wherein the actual data structure is a table having an actual row width and actual column width;
(d) analyzing feedback of the achieved compression ratio from the at least one stream to determine whether an optimal columnar compression operation has been applied and to determine whether an optimal compression ratio is generated, wherein the optimal columnar compression operation is one of the at least one of a plurality of columnar compression operations applied to the at least one stream, and wherein the optimal compression ratio is generated based on a highest compression ratio;
(e) in response to determining that the optimal columnar compression operation has not been applied and the optimal compression ratio is not generated, repeating steps (c) and (d) until the optimal columnar compression operation has been applied and the optimal compression ratio is generated by using feedback of the achieved compression ratio to select another at least one of the plurality of columnar compression operations to apply to the at least one stream to generate a different compression ratio, and analyzing feedback of the different compression ratio; and
(f) in response to determining that the optimal columnar compression operation has been applied and the optimal compression ratio is generated, determining the actual data structure of the initially unknown structured data based on the actual row width and the actual column width corresponding to the applied optimal columnar compression operation and forming the table having the actual row width and the actual column width.

2. The method of claim 1, wherein the applying includes using one of a compression feedback, common delimiters, common cell padding patterns, a combination of the compression feedback, the common delimiters and the common cell padding patterns.

3. The method of claim 2, wherein the estimating includes at least one of:
selecting a variable to represent a plurality of columnar data, and
choosing a variable to represent a plurality of offsets for representing the row width of the estimated data structure.

4. The method of claim 3, wherein the selecting and the choosing is based on at least one of an execution history of the plurality of columnar compression operations, common delimiter patterns, and common cell padding patterns.

5. The method of claim 1, wherein the actual data structure of the initially unknown structured data is determined by at least one of:
detecting an estimated table row width of the initially unknown structured data, and
identifying and optimizing an estimated table column width of the initially unknown structured data.

6. The method of claim 1, further including, pursuant to the compressing the at least one stream, if-when there are more than one of the at least one stream, concatenating the at least one stream into a single output stream, wherein a plurality of columns are formed from the single output stream.

7. A system for real-time column compression of data in a computing storage environment, comprising:
at least one processor, operable in the computing storage environment, wherein the at least one processor is configured for:
(a) estimating a data structure of initially unknown structured data to generate an estimated data structure with a row width and a column width, wherein the estimated data structure includes one or more rows, wherein each row includes two or more columns;
(b) placing the estimated data structure in at least one stream;
(c) applying at least one of a plurality of columnar compression operations to the at least one stream to generate an achieved compression ratio and to determine an actual data structure of the initially unknown structured data, wherein the actual data structure is a table having an actual row width and actual column width;
(d) analyzing feedback of the achieved compression ratio from the at least one stream to determine whether an optimal columnar compression operation has been applied and to determine whether an optimal compression ratio is generated, wherein the optimal columnar compression operation is one of the at least one of a plurality of columnar compression operations applied to the at least one stream, and wherein the optimal compression ratio is generated based on a highest compression ratio
(e) in response to determining that the optimal columnar compression operation has not been applied and the optimal compression ratio is not generated, repeating steps (c) and (d) until the optimal columnar compression operation has been applied and the optimal compression ratio is generated by using feedback of the achieved compression ratio to select another at least one of the plurality of columnar compression operations to apply to the at least one stream to generate a different compression ratio, and analyzing feedback of the different compression ratio; and
(f) in response to determining that the optimal columnar compression operation has been applied and the optimal compression ratio is generated, determining the actual data structure of the initially unknown structured data based on the actual row width and the actual column width corresponding to the applied optimal columnar compression operation and forming the table having the actual row width and actual column width.

8. The system of claim 7, wherein the at least one processor is further configured for, pursuant to the applying, using one of a compression feedback, common delimiters, common cell padding patterns, a combination of the compression feedback, the common delimiters and the common cell padding patterns.

9. The system of claim 7, wherein the at least one processor is further configured for, the estimating, performing at least one of:
selecting a variable to represent a plurality of columnar data, and
choosing a variable to represent a plurality of offsets for representing the table row width of the estimated data structure.

10. The system of claim 9, wherein the at least one processor is further configured for, basing the selecting and choosing on at least one of an execution history of the plurality of columnar compression operations, common delimiter patterns, and common cell padding patterns.

11. The system of claim 7, wherein the at least one processor is further configured for, pursuant to the actual data structure of the initially unknown structured data being determined, performing at least one of:
- detecting an estimated table row width of the initially unknown structured data, and
- identifying and optimizing an estimated table column width of the initially unknown structured data.

12. The system of claim 7, wherein the at least one processor is further configured for, pursuant to the compressing the at least one stream, when there are more than one of the at least one stream, concatenating the at least one stream into a single output stream, wherein a plurality of columns are formed from the single output stream.

13. A computer program product for real-time column compression of data by a processor device, the computer program product comprising a non-transitory computer-readable storage medium having computer-readable program code portions stored therein, the computer-readable program code portions comprising:
- a first executable portion for (a) estimating a data structure of initially unknown structured data to generate an estimated data structure with a row width and a column width, wherein the estimated data structure includes one or more rows, wherein each row includes two or more columns;
- a second executable portion for (b) placing the estimated data structure in at least one stream;
- a third executable portion (c) applying at least one of a plurality of columnar compression operations to the at least one stream to generate an achieved compression ratio and to determine an actual data structure of the initially unknown structured data, wherein the actual data structure is a table having an actual row width and actual column width;
- a fourth executable portion for (d) analyzing feedback of the achieved compression ratio from the at least one stream to determine whether an optimal columnar compression operation has been applied and to determine whether an optimal compression ratio is generated, wherein the optimal columnar compression operation is one of the at least one of a plurality of columnar compression operations applied to the at least one stream, and wherein the optimal compression ratio is generated is based on a highest compression ratio wherein:
- in response to determining that the optimal columnar compression operation has not been applied and the optimal compression ratio is not generated, repeating (c) and (d) until the optimal columnar compression operation has been applied and the optimal compression ratio is generated by using feedback of the achieved compression ratio to select another at least one of the plurality of columnar compression operations to apply to the at least one stream to generate a different compression ratio, and analyzing feedback of the different compression ratio; and
- in response to determining that the optimal columnar compression operation has been applied and the optimal compression ratio is generated, determining the actual data structure of the initially unknown structured data based on the actual row width and the actual column width corresponding to the applied optimal columnar compression operation and forming the table having the actual row width and the actual column width.

14. The computer program product of claim 13, further including a sixth executable portion for, pursuant to the applying, using one of a compression feedback, common delimiters, common cell padding patterns, a combination of the compression feedback, the common delimiters and the common cell padding patterns.

15. The computer program product of claim 13, further including a sixth executable portion for, pursuant to the estimating, performing at least one of:
- selecting a variable to represent a plurality of columnar data, and
- choosing a variable to represent a plurality of offsets for representing the row width of the estimated data structure.

16. The computer program product of claim 15, further including a seventh executable portion for basing the selecting and choosing on at least one of an execution history of the plurality of columnar compression operations, common delimiter patterns, and common cell padding patterns.

17. The computer program product of claim 13, further including a sixth executable portion for, pursuant to the actual data structure of the initially unknown structured data being determined, performing at least one of:
- detecting an estimated table row width of the initially unknown structured data, and
- identifying and optimizing an estimated table column width of the initially unknown structured data.

18. The computer program product of claim 13, further including a sixth executable portion for, pursuant to the compressing the at least one stream, when there are more than one of the at least one stream, concatenating the at least one stream into a single output stream, wherein a plurality of columns are formed from the single output stream.

* * * * *